US011432415B2

(12) United States Patent
Fan

(10) Patent No.: US 11,432,415 B2
(45) Date of Patent: Aug. 30, 2022

(54) FLEXIBLE DISPLAY APPARATUS, ELECTRONIC DEVICE AND MANUFACTURING METHOD FOR FLEXIBLE DISPLAY APPARATUS

(71) Applicant: SHENZHEN ROYOLE TECHNOLOGIES CO., LTD., Guangdong (CN)

(72) Inventor: Xiaofei Fan, Guangdong (CN)

(73) Assignee: SHENZHEN ROYOLE TECHNOLOGIES CO., LTD, Shenzhen (CN)

( * ) Notice: Subject to any disclaimer, the term of this patent is extended or adjusted under 35 U.S.C. 154(b) by 0 days.

(21) Appl. No.: 17/252,188

(22) PCT Filed: Jul. 24, 2018

(86) PCT No.: PCT/CN2018/096872
§ 371 (c)(1),
(2) Date: Dec. 14, 2020

(87) PCT Pub. No.: WO2019/237455
PCT Pub. Date: Dec. 19, 2019

(65) Prior Publication Data
US 2021/0267073 A1    Aug. 26, 2021

(30) Foreign Application Priority Data

Jun. 15, 2018  (WO) ................ PCT/CN2018/091531

(51) Int. Cl.
*G06F 1/16* (2006.01)
*H05K 5/02* (2006.01)
*H05K 5/00* (2006.01)

(52) U.S. Cl.
CPC ......... *H05K 5/0217* (2013.01); *G06F 1/1652* (2013.01); *H05K 5/0017* (2013.01)

(58) Field of Classification Search
CPC .. H05K 5/0217; H05K 5/0017; G06F 1/1616; G06F 1/1652; G06F 1/1656;
(Continued)

(56) References Cited

U.S. PATENT DOCUMENTS

2016/0187711 A1*  6/2016  Kida ................. G02F 1/133308
                                                                349/12
2018/0124931 A1    5/2018  Choi et al.
(Continued)

FOREIGN PATENT DOCUMENTS

CN    101398546 A    4/2009
CN    105513497 A    4/2016
(Continued)

OTHER PUBLICATIONS

NPL search report (Year: 2022).*
(Continued)

*Primary Examiner* — Hung S. Bui
*Assistant Examiner* — Sagar Shrestha
(74) *Attorney, Agent, or Firm* — Hauptman Ham, LLP

(57) ABSTRACT

The present disclosure provides an electronic device, including a housing and a flexible display apparatus. The housing includes a first frame, a second frame, and a hinge connected between the first frame and the second frame. The flexible display apparatus is arranged on the first frame, the second frame, and the hinge. The flexible display apparatus includes a supporting piece and a flexible display screen arranged on the supporting piece. The flexible display screen includes a bendable area, and an elastic adhesive is arranged between a back surface of the flexible display screen in the bendable area and the supporting piece, and the elastic adhesive is located at or near a position between an outer side of the flexible display screen and a corresponding outer side of the (Continued)

supporting piece. The present disclosure also provides a flexible display apparatus of the electronic device.

18 Claims, 13 Drawing Sheets

(58) Field of Classification Search
CPC .... H04M 1/0216; H04M 1/0268; H04M 1/18; G09F 9/301
See application file for complete search history.

(56) References Cited

U.S. PATENT DOCUMENTS

| | | | |
|---|---|---|---|
| 2018/0279489 A1* | 9/2018 | Ochi | H05K 5/0004 |
| 2018/0335679 A1* | 11/2018 | Hashimoto | G06F 1/1641 |
| 2018/0351117 A1* | 12/2018 | Kim | H01L 27/3251 |
| 2019/0033925 A1* | 1/2019 | Hong | G06F 1/1681 |
| 2019/0132947 A1* | 5/2019 | Koo | G02F 1/133305 |
| 2019/0148679 A1* | 5/2019 | Li | H01L 51/0097 345/173 |
| 2019/0196548 A1* | 6/2019 | Kim | G06F 1/1652 |
| 2019/0204867 A1* | 7/2019 | Song | G06F 1/1616 |
| 2020/0090687 A1* | 3/2020 | Khan | H01L 21/6836 |
| 2021/0216103 A1* | 7/2021 | Chen | G06F 1/1616 |

FOREIGN PATENT DOCUMENTS

| | | |
|---|---|---|
| CN | 106486018 A | 3/2017 |
| CN | 107437378 A | 12/2017 |
| CN | 208316809 U | 1/2019 |

OTHER PUBLICATIONS

The International Search Report issued in corresponding International Application No. PCT/CN2018/096872 dated Mar. 13, 2019, pp. 1-2, State Intellectual Property Office of the P.R. China, Beijing, China.

* cited by examiner

A flexible display apparatus including a flexible display screen and a supporting piece is provided, where the flexible display screen includes a bendable area — S1

An elastic adhesive is arranged between a back surface of the flexible display screen in the bendable area and the supporting piece, and the elastic adhesive is located at or near a position between an outer side of the flexible display screen and a corresponding outer side of the supporting piece — S2

FIG. 13

FLEXIBLE DISPLAY APPARATUS, ELECTRONIC DEVICE AND MANUFACTURING METHOD FOR FLEXIBLE DISPLAY APPARATUS

TECHNICAL FIELD

The present disclosure relates to fields of display devices of electronic devices, and in particular to a flexible display apparatus, an electronic device having the flexible display apparatus, and a manufacturing method for the flexible display apparatus.

BACKGROUND

With the development of the flexible display screen, the electronic device having a foldable display screen has appeared in the related art. The existing electronic device having the foldable display screen generally realizes a bending of the flexible display screen through a hinge, and realize a support for the flexible display screen through the supporting plate attached to a back surface of the flexible display screen. The supporting plate and the flexible display screen are slidably attached to facilitate bending or flattening of the screen body. However, since the supporting plate and the flexible display screen are in sliding fit, that is, there are slits between the supporting plate and the flexible display screen, so external dust, particles and other debris are easy to enter between the supporting plate and the flexible display screen, which causes the flexible display screen to be worn out, thereby affecting a performance of the display screen.

SUMMARY

The present disclosure provides a flexible display apparatus capable of preventing a back surface of the flexible display screen from being worn out, an electronic device having the flexible display apparatus, and a manufacturing method for the flexible display apparatus.

A flexible display apparatus described in the present disclosure includes a supporting piece and a flexible display screen arranged on the supporting piece. The flexible display screen includes a bendable area. An elastic adhesive is arranged between a back surface of the flexible display screen in the bendable area and the supporting piece. The elastic adhesive is located at or near a position between an outer side of the flexible display screen and a corresponding outer side of the supporting piece.

The present disclosure also provides an electronic device, including a housing and a flexible display apparatus. The housing includes a first frame, a second frame, and a hinge connected between the first frame and the second frame. The flexible display apparatus is arranged on the first frame, the second frame and the hinge. The flexible display apparatus includes a supporting piece and a flexible display screen arranged on the supporting piece. The flexible display screen includes a bendable area. An elastic adhesive is arranged between a back surface of the flexible display screen in the bendable area and the supporting piece. The elastic adhesive is located at or near a position between an outer side of the flexible display screen and a corresponding outer side of the supporting piece.

The present disclosure also provides a manufacturing method for the flexible display apparatus, including following steps.

A flexible display apparatus including a flexible display screen and a supporting piece is provided, wherein the flexible display screen includes a bendable area.

An elastic adhesive is arranged between a back surface of the flexible display screen in the bendable area and the supporting piece, and the elastic adhesive is located at or near a position between an outer side of the flexible display screen and a corresponding outer side of the supporting piece. The elastic adhesive connects the flexible display screen and the supporting piece.

In the present disclosure, an elastic adhesive is arranged between a back surface of the flexible display screen in the bendable area and the supporting piece, and the elastic adhesive is located at or near a position between an outer side of the flexible display screen and a corresponding outer side of the supporting piece. Therefore, the elastic adhesive can prevent dust, particles, or other debris from entering between the supporting piece and the flexible display screen. When the electronic device is bent or flattened through the hinge, it is not easy to cause the back surface of the flexible display screen to be worn out, and the elastic adhesive can prevent the flexible display screen from separating from the supporting piece.

BRIEF DESCRIPTION OF THE ACCOMPANYING DRAWINGS

In order to more clearly describe the technical solutions in the embodiments of the present disclosure, the following will briefly introduce the accompanying drawings needed in the embodiments. Obviously, the accompanying drawings in the following description are only some embodiments of the present disclosure. A person of ordinary skill in the art can obtain other drawings based on these drawings without creative work.

FIG. 13 is a flowchart of a manufacturing method for a flexible display apparatus of an electronic device of the present disclosure.

DETAILED DESCRIPTION OF ILLUSTRATED EMBODIMENTS

Figure 1:
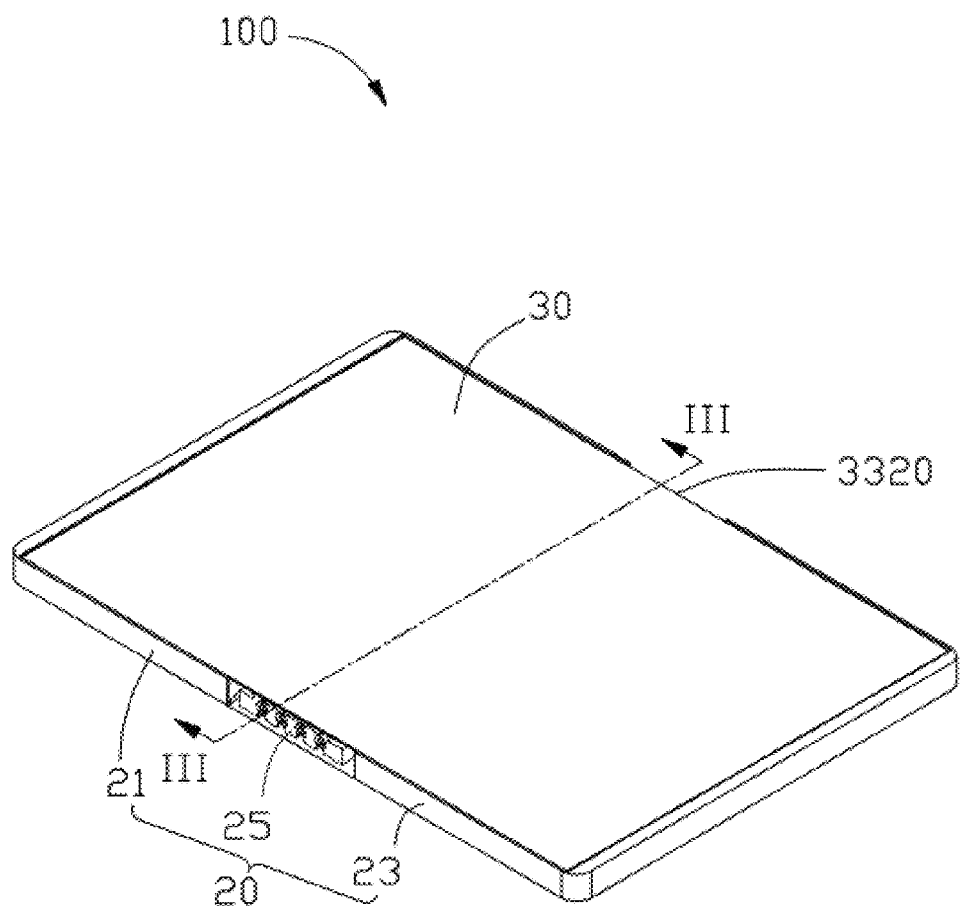
FIG. 1 is a schematic diagram of a three-dimensional structure of the electronic device in a first embodiment of the present disclosure.

The technical solutions in the embodiments of the present disclosure will be clearly and completely described below with reference to the accompanying drawings in the embodiments of the present disclosure. Obviously, the described embodiments are only a part of the embodiments of the present disclosure, not all the embodiments. All other embodiments obtained by those of ordinary skill in the art based on the embodiments of the present disclosure without creative work shall fall within the protection scope of the present disclosure.

In the description of the embodiments of the present disclosure, it should be understood that the orientation or positional relationship indicated by the terms "upper", "lower", "left", "right", etc. is based on an orientation or a positional relationship shown in the drawings, and is only for the convenience of describing the present disclosure and simplifying the description, instead of implying or indicating that the device or element referred to must have a specific orientation, be constructed and operated in a specific orientation, and therefore cannot be understood as a limitation of the present disclosure.

In the description of the embodiments of the present disclosure, it should be understood that the orientation or positional relationship indicated by the term "thickness" is based on the orientation or the positional relationship shown in the drawings, which is only for the convenience of describing the present disclosure and simplifying the description, and instead of implying or indicating that the device or element referred to must have a specific orientation, be constructed and operated in a specific orientation, so it cannot be understood as a limitation of the present disclosure.

Figure 2:
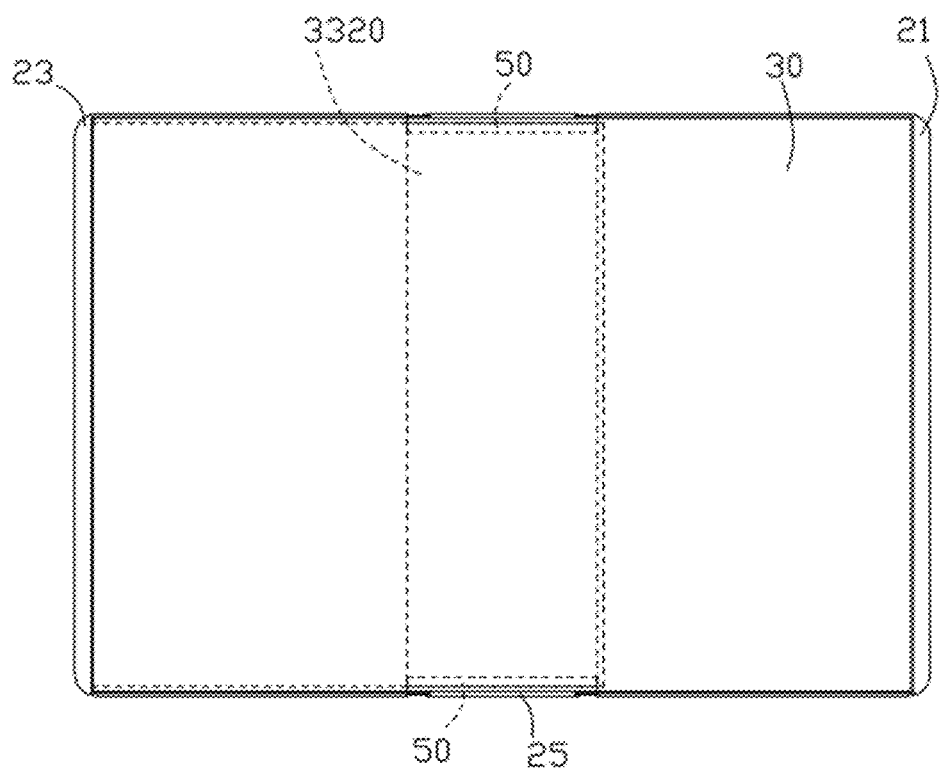
FIG. 2 is a schematic diagram of a top view of the electronic device in FIG. 1.
Figure 3:
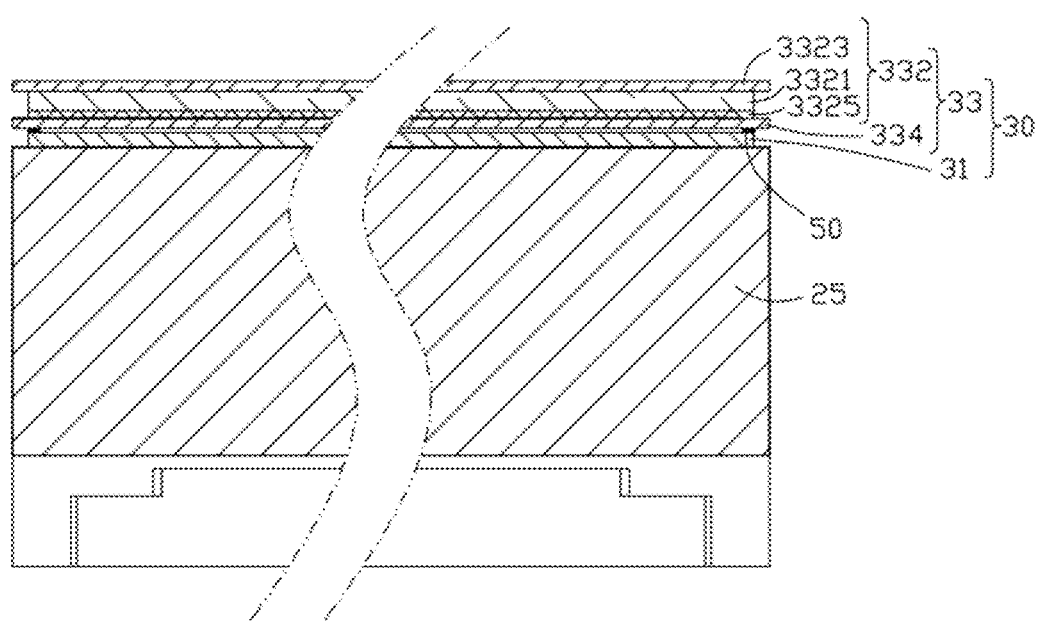
FIG. 3 is a schematic diagram of a partial cross-sectional structure along the line III-III in FIG. 1.

Referring to FIGS. 1 to 3 together, FIG. 1 is a schematic diagram of a three-dimensional structure of an electronic device in a first embodiment of the present disclosure; FIG. 2 is a schematic diagram of a top view of the electronic device in FIG. 1; FIG. 3 is a schematic diagram of a partial cross-sectional structure along the line III-III in FIG. 1. The electronic device 100 in the first embodiment of the present disclosure includes a housing 20 and a flexible display apparatus 30 arranged on the housing 20. The housing 20 includes a first frame 21, a second frame 23 and a hinge 25 connected between the first frame 21 and the second frame 23. The flexible display apparatus 30 is arranged on the first frame 21, the second frame 23 and the hinge 25. The flexible display apparatus 30 includes a supporting piece 31 arranged on the hinge 25 and a flexible display screen 33 arranged on the supporting piece 31. The flexible display screen 33 includes a screen body 332 and a protective layer 334 fixedly attached to a back surface of the screen body 332. The screen body 332 includes a bendable area 3320, an elastic adhesive 50 is arranged between a back surface of the protective layer 334 in the bendable area 3320 and the supporting piece 31. The elastic adhesive 50 is located at or near a position between an outer side of the flexible display screen 33 and a corresponding outer side of the supporting piece 31. The elastic adhesive 50 connects the supporting piece 31 with the protective layer 334. When the electronic device 100 is bent or unfolded through the hinge 25, the supporting piece 31 and the protective layer 334 of the flexible display screen 33 move relative to each other, and the elastic adhesive 50 is also elastically deformed. The back surface of the screen body 332 is provided with the protective layer 334, which can prevent the back surface of the flexible display screen 332 from directly contacting the supporting piece 31 and being worn; in addition, the elastic adhesive 50 is provided between the supporting piece 31 and the flexible display screen 33, which can also reduce external dust entering between the supporting piece 31 and the flexible display screen 33. In this embodiment, the front surface of the flexible display screen 33 refers to a light emitting surface, and the back surface of the flexible display screen 33 refers to a surface facing away from the light emitting surface; the outer side of the flexible display screen 33 and the outer side of the supporting piece 31 both refer to an outermost edge and an area close to the outermost edge.

In this embodiment, the supporting piece 31 is a bendable thin steel sheet, and the elastic adhesive 50 is an adhesive strip such as double-sided tape, solid glue, glue, and so on.

In this embodiment, the electronic device 100 is a mobile phone. It can be understood that, in other embodiments, the electronic device 100 may be, but is not limited to, a radio phone, a pager, a Web browser, a notebook, a calendar, and/or a PDA of a receiver of a global positioning system (GPS).

The back surface of the screen body 332 of the electronic device 100 of the present disclosure is provided with the protective layer 334, and the elastic adhesive 50 is arranged between the back surface of the protective layer 334 in the bendable area 3320 and the supporting piece 31, and the elastic adhesive 50 can seal the gap between the supporting piece 31 and the flexible display screen 332, which can prevent the dust, particles and other debris from entering between the supporting piece 31 and the flexible display screen 332. When the electronic device 100 is bent or flattened through the hinge 25, it is not easy to cause the flexible display screen 332 to be worn out. In addition, the elastic adhesive 50 can prevent the flexible display screen 33 from separating from the supporting piece 31 to prevent display failure or damage of the flexible display screen 33.

As shown in FIG. 3, the elastic adhesives 50 are arranged on the left and right sides of the bendable area 3320 between the protective layer 334 and the supporting sheet 31 respectively. The area of the protective layer 334 corresponding to the bendable area 3320 is slidably stacked on the supporting piece 31 through the elastic adhesive 50. The protective layer 334 can prevent the supporting piece 31 from wearing the back surface of the screen body 332.

In this embodiment, a width of the supporting piece 31 is smaller than a width of the protective layer 334, that is, the left and right sides of the protective layer 334 extend out of the left and right sides of the supporting piece 31, respectively. The left and right sides are the two outer sides of the bendable area 3320 of the electronic device 100. The left and right sides of the back surface of the protective layer 334 adjacent to the supporting piece 31 are respectively provided with the elastic adhesives 50. The two elastic adhesives 50 are respectively provided on the left and right sides of the bendable area 3320 between the supporting piece 31 and the protective layer 334, so as to reduce dust entering between the supporting piece 31 and the protective layer 334.

In this embodiment, the protective layer 334 is a liquid metal sheet, and the liquid metal sheet is fixedly attached to the back surface of the screen body 332.

In other embodiments, the protective layer 334 may be a wear-resistant plastic sheet or a wear-resistant rubber sheet fixedly attached to the back surface of the screen body 332.

The screen body 332 includes a flexible display plate 3321, a cover plate 3323 stacked on a front surface of the flexible display plate 3321, and a shading black glue layer 3325 stacked on a back surface of the flexible display plate 3321. The protective layer 334 is attached to a surface of the shading black glue layer 3325 facing away from the flexible display plate 3321. The width of the cover plate 3323 is greater than the width of the flexible display plate 3321, that is, the left and right sides of the cover plate 3323 extend out of the left and right sides of the flexible display plate 3321, respectively. The width of the shading black glue layer 3325 and the width of the flexible display plate 3321 are the same.

In this embodiment, the width of the screen body 332 is smaller than the width of the protective layer 334 and shrinks relative to the protective layer 334, which is beneficial for the protective layer 334 to better protect the screen body 332.

In other embodiments, the width of the supporting piece 31 is the same as the width of the protective layer 334.

The elastic adhesive 50 has a long strip shape, and the elastic adhesive 50 extends along the outer side of the supporting piece 31, that is, the elastic adhesive 50 extends along a longitudinal direction of the screen body 332. The elastic adhesive 50 seals the gap between the supporting piece 31 and the protective layer 334 to prevent dust from entering between the supporting piece 31 and the protective layer 334.

The elastic adhesive 50 is an adhesive strip. When installing the elastic adhesive 50, firstly, one side of the two elastic adhesives 50 are pasted on the front surface of the supporting piece 31 adjacent to the left and right sides of the supporting piece 31 respectively, so that each elastic adhesive 50 extends along the left and right outer sides of the supporting piece 31 in the bendable area 3320; then the flexible display screen 33 is stacked on the supporting piece 31, so that the other side of the two elastic adhesives 50 are pasted on the back surface of the protective layer 334, and the two elastic adhesives 50 are respectively adjacent to the left and right sides of the protective layer 334. At this time, the two elastic adhesives 50 are arranged between the supporting piece 31 and the protective layer 334, and the elastic adhesive 50 connects the supporting piece 31 and the flexible display screen 33 to prevent the flexible display screen 33 from separating from the supporting piece 31. Of course, in other embodiments, the elastic adhesive can also be pasted on the back surface of the protective layer firstly and then pasted on the front surface of the supporting piece to achieve the same effect.

Figure 4:
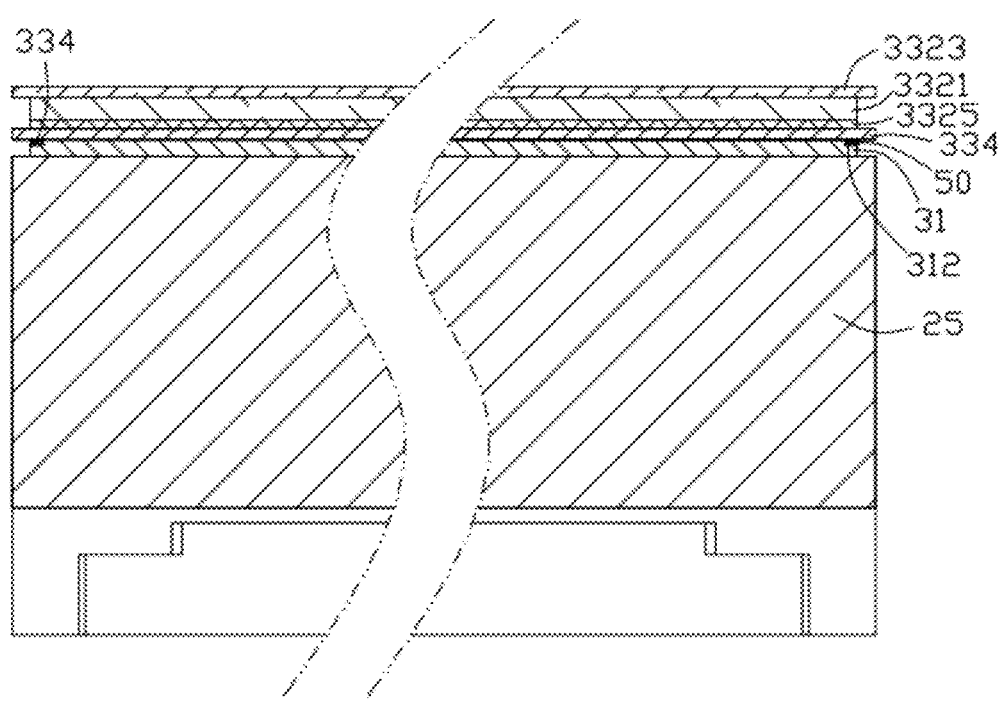
FIG. 4 is a schematic diagram of a partial cross-sectional structure of an electronic device in a second embodiment of the present disclosure.

Please referring to FIG. 4, FIG. 4 is a cross-sectional diagram of a partial structure of the electronic device in a second embodiment of the present disclosure. The structure of the second embodiment of the electronic device of the present disclosure is similar to that of the first embodiment, except that: in the second embodiment, two receiving grooves are defined in the surface of the supporting piece 31 facing the protective layer 334 and are adjacent to the left and right sides of the protective layer 334 respectively, and the two elastic adhesives 50 are received and attached to the two receiving grooves 312 respectively, and the surface of each elastic adhesive 50 facing the protective layer 334 exposes out of the surface of the supporting piece 334 facing the protective layer 334, which is convenient for each elastic adhesive 50 to be attached to the protective layer 334.

Each receiving groove 312 extends along the corresponding outer side of the supporting piece 31, that is, each receiving groove 312 extends along a longitudinal direction of the screen body 332. The depth of each receiving groove 312 is slightly smaller than the thickness of the elastic adhesive 50. When the elastic adhesive 50 is received and attached to the receiving groove 312, the elastic adhesive 50 partially exposes out of the surface of the supporting piece 31 facing the protective layer 334.

In this embodiment, the cross section of each receiving groove 312 is rectangular, and the cross section of the elastic adhesive 50 is also rectangular. The receiving groove 312 can increase the contact area between the elastic adhesive 50 and the supporting piece 334, thereby making the elastic adhesive 50 adhere to the supporting piece 31 and the protective layer 334 more firmly; and the elastic adhesive 50 is partially received in the receiving groove 312 such that the thickness of the flexible display apparatus 30 can be reduced, and the thickness of the electronic device 100 can be thus reduced, which is convenient to carry and use.

In other embodiments, the cross-section of each receiving groove 312 may be triangular, semi-circular, polygonal or irregular, and the cross-section of the elastic adhesive 50 may be triangular, semi-circular, polygonal or irregular.

Figure 5:
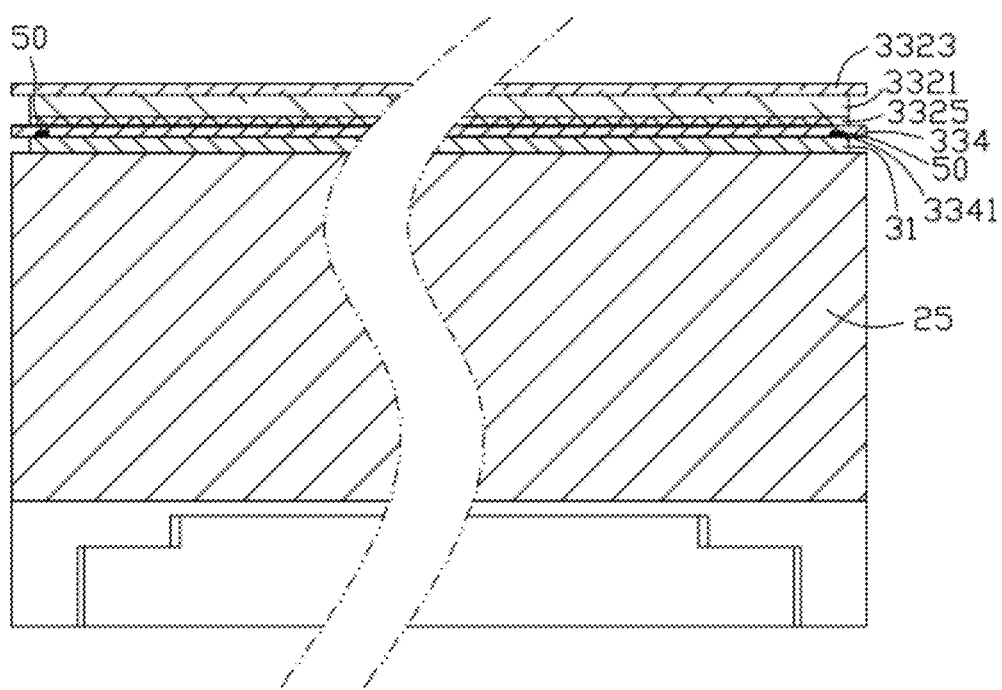
FIG. 5 is a schematic diagram of a partial cross-sectional structure of an electronic device in a third embodiment of the present disclosure.

Please referring to FIG. 5, FIG. 5 is a cross-sectional diagram of a partial structure of the electronic device in a third embodiment of the present disclosure. The structure of the third embodiment of the electronic device of the present disclosure is similar to the structure of the first embodiment, except that: in the third embodiment, two receiving grooves 3341 are defined in the surface of the protective layer 334 facing the supporting piece 31 and are adjacent to the left and right sides of the supporting piece 31 respectively. The two elastic adhesives 50 are received and attached to the two receiving grooves 3341 respectively. One surface of each elastic adhesive 50 facing the supporting piece 31 exposes out of the surface of the protective layer 334 facing the supporting piece 31 so that each elastic adhesive 50 is attached to the supporting piece 31.

Each receiving groove 3341 extends along the corresponding side of the protective layer 334, that is, the receiving groove 3341 extends along the longitudinal direction of the screen body 332. The depth of each receiving groove 3341 is slightly smaller than the thickness of the elastic adhesive 50. When the elastic adhesive 50 is received and attached to the receiving groove 3341, the elastic adhesive 50 partially exposes out of the surface of the protective layer 334 facing the supporting piece 31.

In this embodiment, the cross section of each receiving groove 3341 is rectangular, and the cross section of the elastic adhesive 50 is also rectangular. The receiving groove 3341 can increase the contact area between the elastic adhesive 50 and the protective layer 334, so that the elastic adhesive 50 can be adhered to the protective layer 334 and the supporting piece 31 more firmly; and the elastic adhesive 50 is partially received in the receiving groove 3341 such that the thickness of the flexible display apparatus 30 and the electronic device 100 can be reduced, which is convenient to carry and use.

In other embodiments, the cross section of each receiving groove 3341 may be triangular, semicircular, polygonal, or irregular, and the cross section of the elastic adhesive 50 may be triangular, semicircular, polygonal, or irregular.

Figure 6:
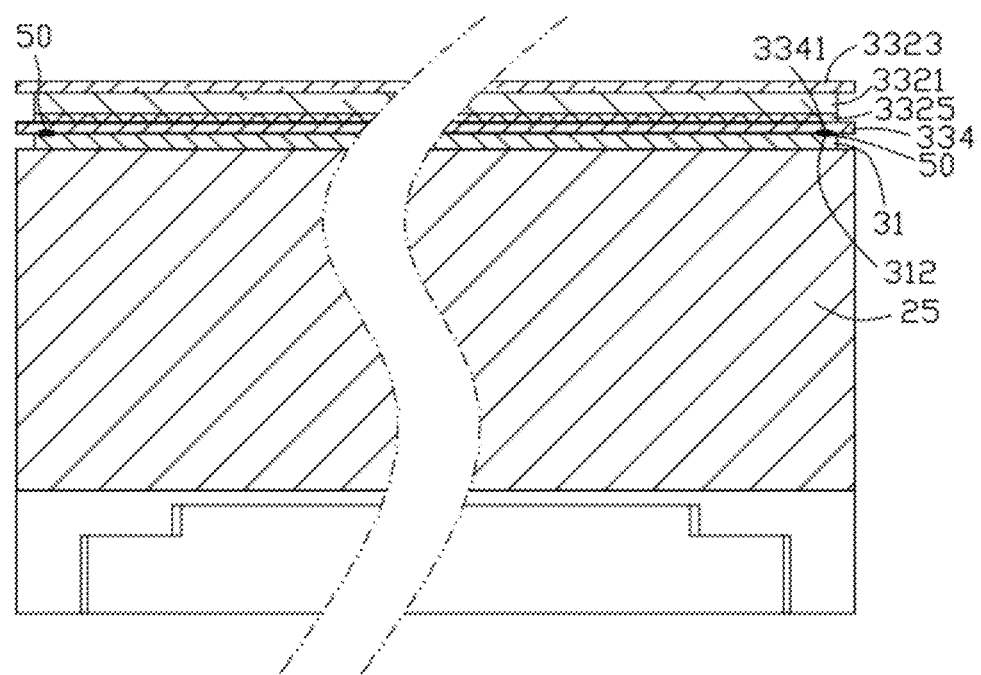
FIG. 6 is a schematic diagram of a partial cross-sectional structure of an electronic device in a fourth embodiment of the present disclosure.

Please referring to FIG. 6, FIG. 6 is a cross-sectional diagram of a partial structure of the electronic device in a fourth embodiment of the present disclosure. The structure of the fourth embodiment of the electronic device of the present disclosure is similar to the structure of the second embodiment, except that: in the fourth embodiment, the protective layer 334 and the supporting piece 31 are defined with corresponding receiving grooves on opposite sides, that is, receiving grooves 3341 are respectively defined in one surface of the protective layer 334 facing the supporting piece 31 adjacent to the left and right sides, and two receiving grooves 312 respectively corresponding to the receiving grooves 3341 are defined in one surface of the supporting piece 31 facing the protective layer 334. A part of each elastic adhesive 50 is accommodated and attached to the receiving groove 3341 of the protective layer 334, and another part of the elastic adhesive 50 is accommodated and attached to the receiving groove 312 of the supporting piece 31. The elastic adhesive 50 can increase the contact area with the protective layer 334 and the supporting piece 31, so that the elastic adhesive 50 can be adhered to the protective layer 334 and the supporting piece 31 more firmly, and can reduce the thickness of the flexible display apparatus 30. That is, the elastic adhesive 50 does not occupy the thickness of the flexible display apparatus 30.

Figure 7:
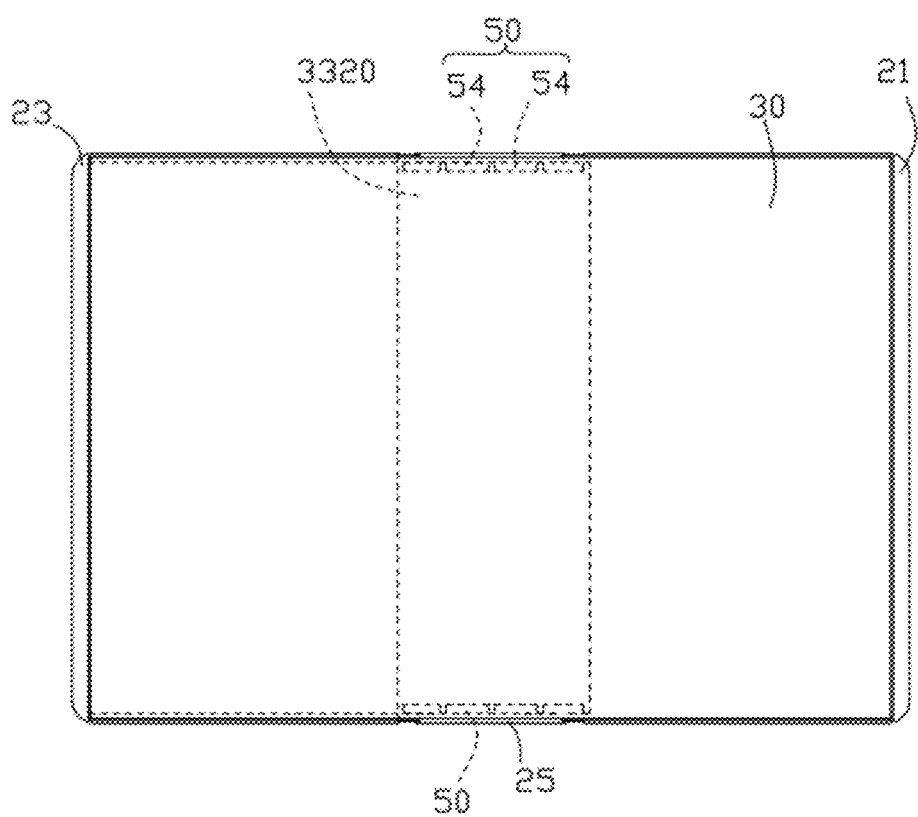
FIG. 7 is a schematic diagram of a top view of the electronic device in a fifth embodiment of the present disclosure.

Please referring to FIG. 7, which is a schematic diagram of a top view of the electronic device in a fifth embodiment of the present disclosure. The structure of the fifth embodiment of the electronic device of the present disclosure is similar to the structure of the first embodiment, except that: in the fifth embodiment, the elastic adhesive 50 which is located at the back surface of the protective layer 334 adjacent to the left and right sides of the supporting piece 31 includes a plurality of elastic adhesive pieces 54, and the elastic adhesive pieces 54 on the same side are distributed along the corresponding side of the supporting piece 31, that is, the elastic adhesive pieces 54 on the same side extend along the longitudinal direction of the screen body 332. The plurality of elastic adhesive pieces 54 on the same side are linearly arranged along the side of the supporting piece 31, and adjacent elastic adhesive pieces 54 on the same side are separated from each other by a gap. The length of the gap (that is, the distance between adjacent elastic adhesive pieces) is less than the length of each elastic adhesive piece 54.

In this embodiment, the plurality of elastic adhesive pieces 54 on the same side are arranged along the corresponding side of the supporting piece 31. The plurality of elastic adhesive pieces 54 in this embodiment can not only make the supporting piece 31 and the protective layer 334 connect firmly, but also save the amount of elastic adhesive 50. In addition, since the elastic adhesive pieces 54 are independent of each other, even if one elastic adhesive piece 54 fails, it will not involve other elastic adhesive pieces 54, so that the overall structure of the electronic device 100 is more stable.

In other embodiments, a plurality of receiving grooves are defined in the surface of the supporting piece 31 facing the protective layer 334 adjacent to the left and right sides of the protective layer 334, and each receiving groove accommodates and attaches one elastic adhesive piece 54. A surface of each elastic adhesive piece 54 facing the protective layer 334 exposes out of a surface of the supporting piece 31 facing the protective layer 334, so that each elastic adhesive piece is attached to the protective layer 334.

In other embodiments, a plurality of receiving grooves are respectively defined in the surface of the protective layer 334 facing the supporting piece 31 adjacent to the left and right sides of the supporting piece 31, and each receiving groove accommodates and attaches one elastic adhesive piece 54. A surface of each elastic adhesive piece 54 facing the supporting piece 31 exposes out of a surface of the protective layer 334 facing the supporting piece 31, so that each elastic adhesive piece 54 is attached to the supporting piece 31.

Figure 8:
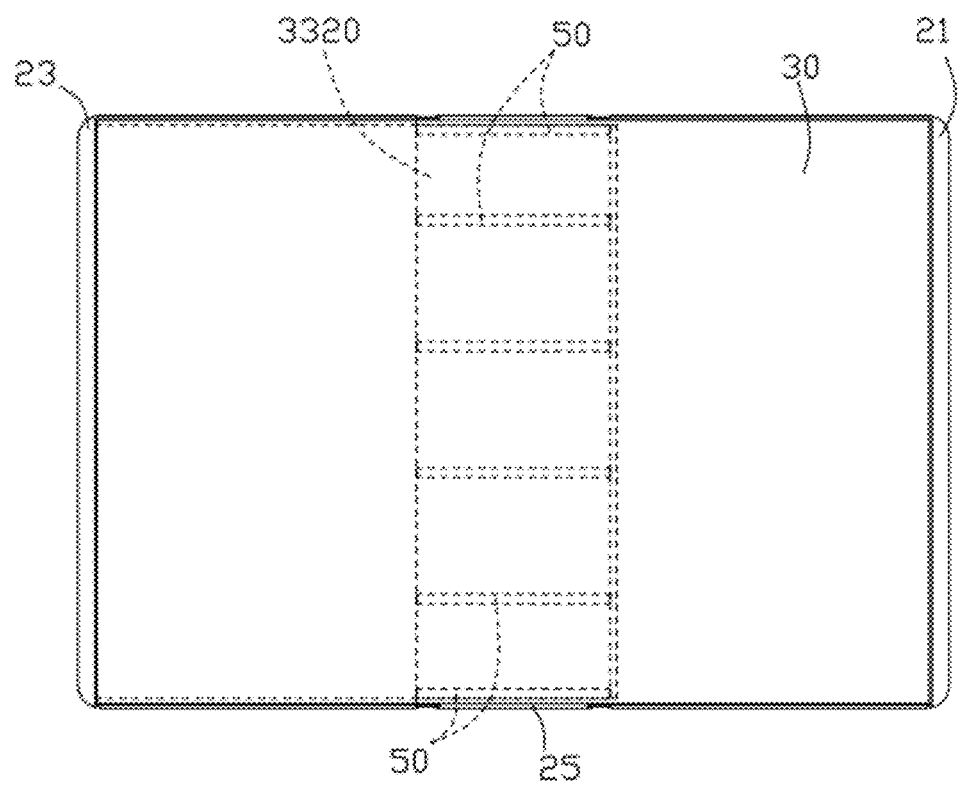
FIG. 8 is a schematic diagram of a top view of the electronic device in a sixth embodiment of the present disclosure.

Please referring to FIG. 8, FIG. 8 is a schematic diagram of a top view of the electronic device in a sixth embodiment of the present disclosure. The structure of the sixth embodiment of the electronic device of the present disclosure is similar to the structure of the first embodiment, except that: in the sixth embodiment, a plurality of elastic adhesives 50 spaced apart from each other are arranged in the bendable area 3320 between the protective layer 334 and the supporting piece 31. Each elastic adhesive 50 is an elastic adhesive strip, and each elastic adhesive strip extends along the side of the supporting piece 31, that is, each elastic adhesive 50 extends along the longitudinal direction of the screen body 332.

In this embodiment, a plurality of the elastic adhesive strips are arranged in array along a width direction of the supporting piece 31, and the plurality of elastic adhesive strips can make the supporting piece 31 and the protective layer 334 connect more firmly, thereby preventing the protective layer 334 from arching in the bendable area 3320.

Figure 9:
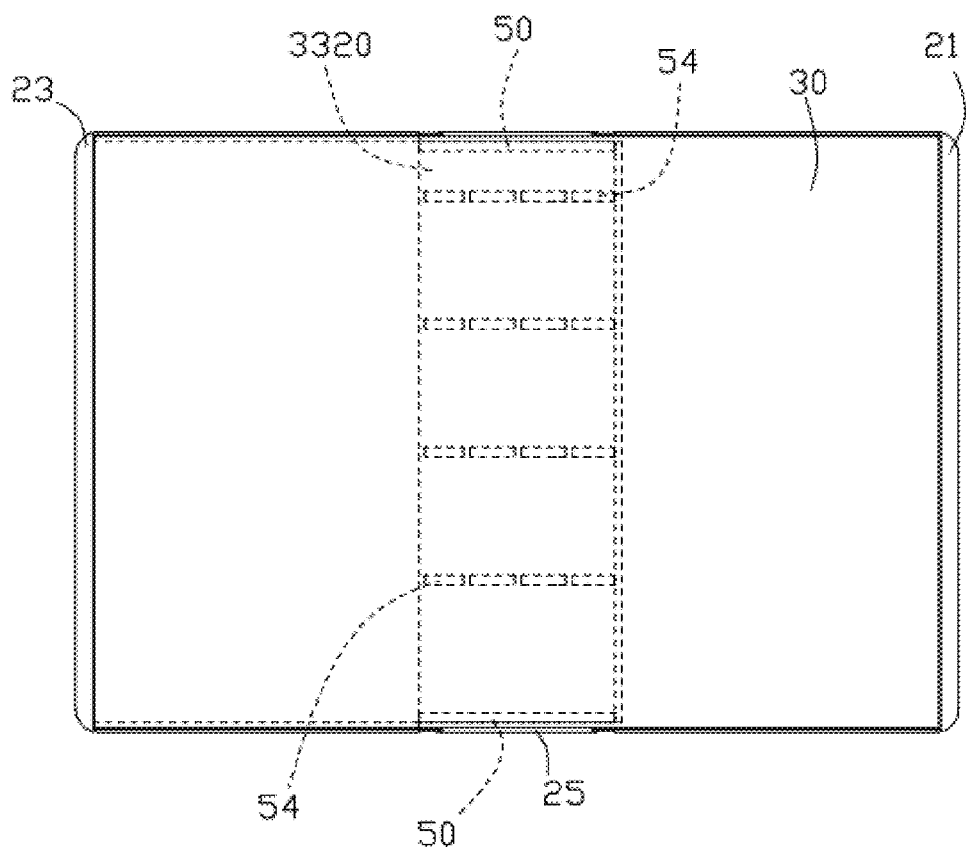
FIG. 9 is a schematic diagram of a top view of the electronic device in a seventh embodiment of the present disclosure.

Please referring to FIG. 9, FIG. 9 is a schematic diagram of a top view of the electronic device in a seventh embodiment of the present disclosure. The structure of the seventh embodiment of the electronic device of the present disclosure is similar to that of the first embodiment, except that: in the seventh embodiment, in addition to the elastic adhesives 50 provided on the left and right sides between the supporting piece 31 and the protective layer 334, the supporting piece 31 and the protective layer 334 are also provided with a plurality of elastic adhesives 50 spaced from each other in the bendable area 3320. The plurality of elastic adhesives 50 are distributed along the width direction of the screen body 332. Each elastic adhesive 50 includes a plurality of spaced elastic adhesive pieces 54 distributed along the side of the supporting piece 31, that is, the plurality of elastic adhesive pieces 54 are arranged in array along the longitudinal direction of the screen body 332.

In this embodiment, each adhesive piece 54 is rectangular. The plurality of elastic adhesive pieces 54 in this embodiment can make the supporting piece 31 and the protective layer 334 connect more firmly, and can save the amount of elastic adhesive 50. As the elastic adhesive pieces 54 are independent of each other, even if one elastic adhesive piece 54 fails, it will not involve the elastic adhesive pieces 54 in other positions, which makes the overall structure of the electronic device 100 more stable.

Figure 10:
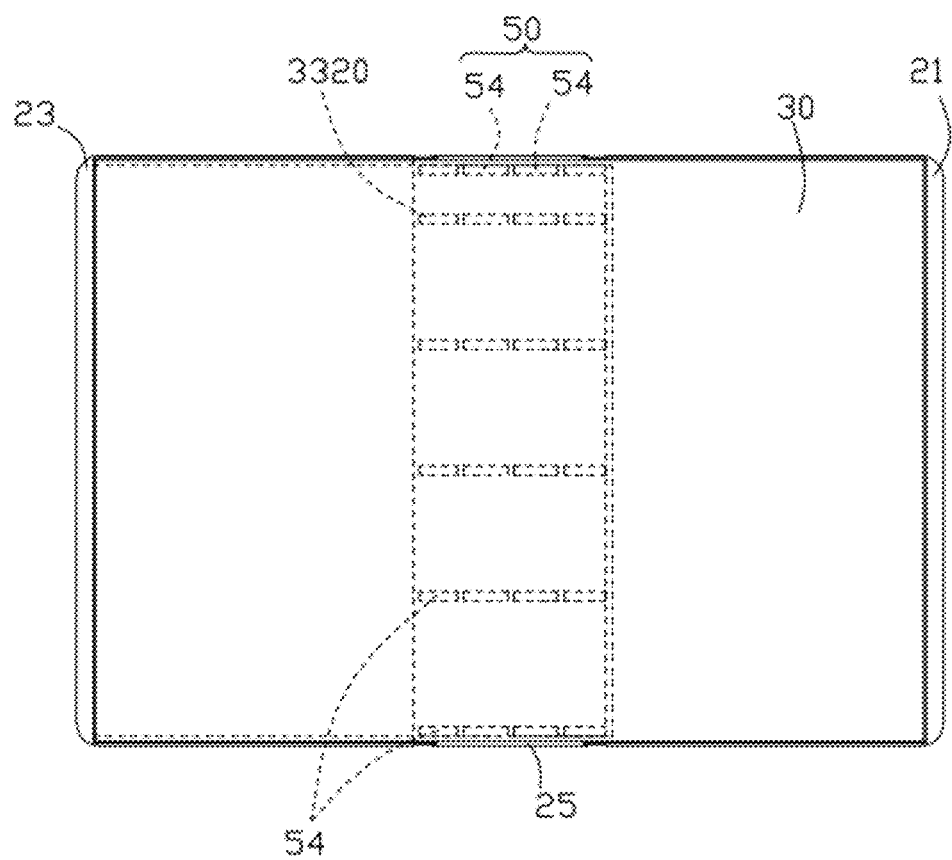
FIG. 10 is a schematic diagram of a top view of the electronic device in an eighth embodiment of the present disclosure.

Please referring to FIG. 10, FIG. 10 is a schematic diagram of a top view of the electronic device in an eighth embodiment of the present disclosure. The structure of the eighth embodiment of the electronic device of the present disclosure is similar to the structure of the fifth embodiment, except that: in the eighth embodiment, in addition to the elastic adhesives 50 each composed of a plurality of elastic adhesive pieces 54 are respectively arranged on the left and right sides between the supporting piece 31 and the protective layer 334, a plurality of elastic adhesives 50 spaced apart from each other are also arranged in the bendable area 3320 between the supporting piece 31 and the protective layer 334, and the plurality of the elastic adhesives 50 extend along the length of the screen body 332. Each elastic adhesive 50 includes a plurality of spaced elastic adhesive pieces 54 distributed along the side of the supporting piece 31, that is, the plurality of the elastic adhesive pieces 54 are arranged in array along the longitudinal direction of the screen body 332.

In this embodiment, each elastic adhesive piece 54 is rectangular, and the plurality of elastic adhesive pieces 54 can make the supporting piece 31 and the protective layer 334 connect more firmly, and can save the amount of elastic adhesive 50.

Figure 11:
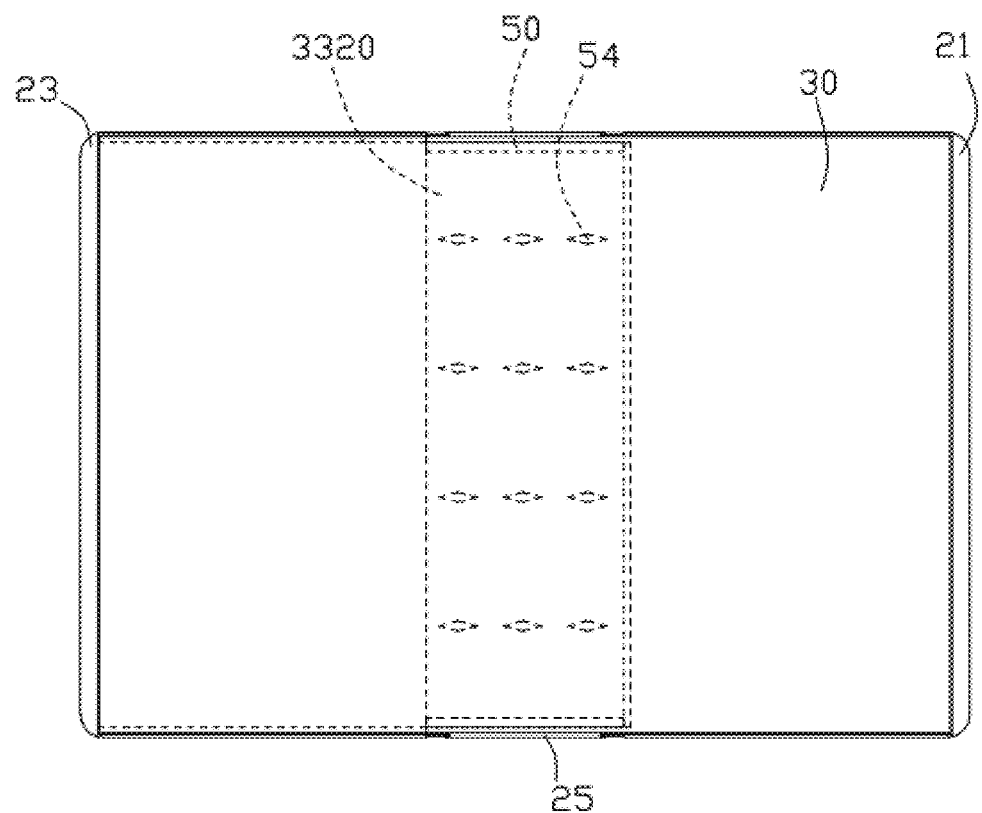
FIG. 11 is a schematic diagram of a top view of the electronic device in a ninth embodiment of the present disclosure.

Please referring to FIG. 11, FIG. 11 is a schematic diagram of a top view of an electronic device in a ninth embodiment of the present disclosure. The structure of the ninth embodiment of the electronic device of the present disclosure is similar to that of the seventh embodiment, except that: in the ninth embodiment, the plurality of elastic adhesives 50 spaced apart from each other which are located in the bendable area 3320 between the supporting piece 31 and the protective layer 334, each includes a plurality of prismatic elastic adhesive pieces 54 spaced apart from each other. The plurality of elastic adhesive pieces 54 can make the supporting piece 31 and the protective layer 334 connect more firmly, and can save the amount of elastic adhesive 50.

Figure 12:
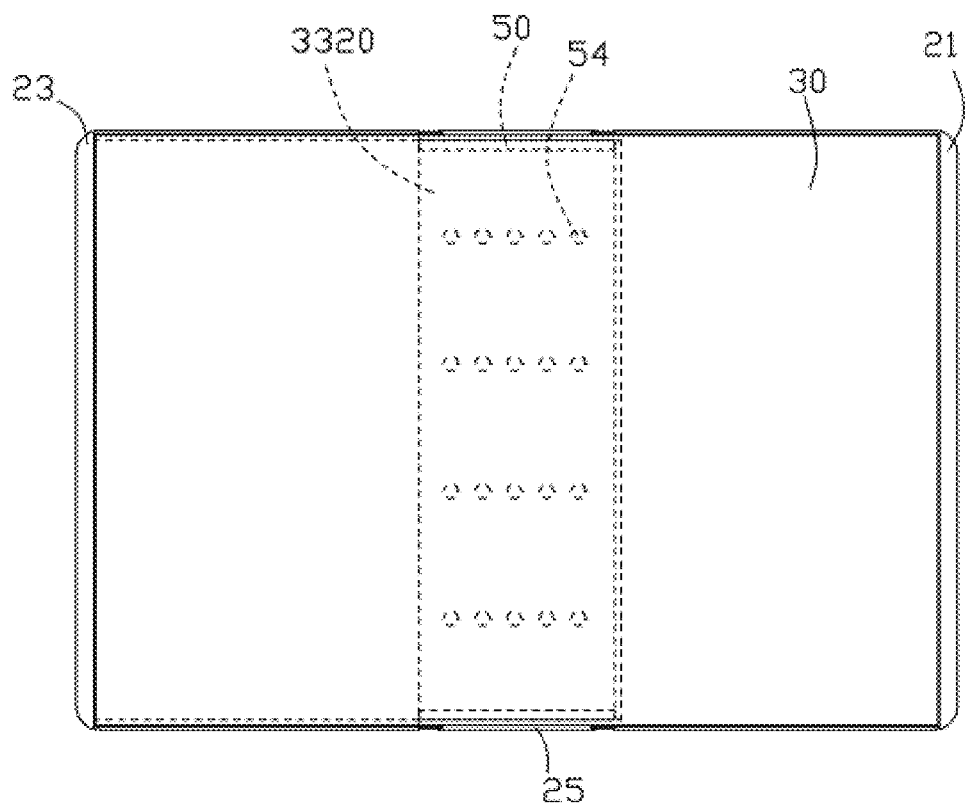
FIG. 12 is a schematic diagram of a top view of the electronic device in a tenth embodiment of the present disclosure.

Please referring to FIG. 12, FIG. 12 is a schematic diagram of a top view of the electronic device in a tenth embodiment of the present disclosure. The structure of the tenth embodiment of the electronic device of the present disclosure is similar to the structure of the seventh embodiment, except that: in the tenth embodiment, the plurality of elastic adhesives 50 spaced apart from each other which are located in the bendable area 3320 between the supporting piece 31 and the protective layer 334, each includes a plurality of circular elastic adhesive pieces 54 spaced apart from each other. The plurality of elastic adhesive pieces 54 can make the supporting piece 31 and the protective layer 334 connect more firmly, and can save the amount of elastic adhesive 50.

In other embodiments, each elastic adhesive piece 54 may also be polygonal, elliptical, or irregular.

Understandably, in addition to the screen body, the flexible display screen of the present disclosure may not include or only include any one or more or all of the shading black glue layer, the protective layer and the cover plate.

The elastic adhesive 50 of the above embodiments has elasticity, so it can produce tensile deformation when the supporting piece 31 slides relative to the flexible display screen 33. When the relative position of the supporting piece 31 and the flexible display screen 33 is restored, the elastic adhesive 50 will automatically shrink and deform to an initial state without being pulled off due to its elasticity. Furthermore, the degree of deformation of the elastic adhesive 50 is proportional to the sliding distance of the supporting piece 31 relative to the flexible display screen 33, that is, $c^2=a^2+b^2$, where c is the length of the elastic adhesive 50 after stretching and deformation, and a is the sliding distance of the supporting piece 31 relative to the flexible display screen 33, b is the distance between the supporting piece 31 and the flexible display screen 33 in the thickness direction. In other words, the stretching range of the elastic adhesive 50 satisfies $\Delta c=\sqrt{a^2+b^2}-b$. X is set to be a sliding direction of the supporting piece 31 relative to the flexible display screen 33, and Y is set to be a thickness direction of the supporting piece 31. When the supporting piece 31 slides relative to the flexible display screen 33, the elastic adhesive 50 stretches and deforms in a direction inclined to both X and the thickness direction Y. The stretching direction of the elastic adhesive 50 is inclined to the sliding direction of the flexible display screen 33 relative to the supporting piece 31.

Referring to FIG. 13, a manufacturing method for a flexible display apparatus provided in the present disclosure includes the following steps.

Block S1: a flexible display apparatus 30 including a flexible display screen 33 and a supporting piece 31 is provided, where the flexible display screen 33 includes a bendable area 3320.

Block S2: an elastic adhesive 50 is arranged between a back surface of the flexible display screen 33 in the bendable area and the supporting piece 31, and the elastic adhesive 50 is located at or near a position between an outer side of the flexible display screen 33 and a corresponding outer side of the supporting piece 31.

The flexible display screen 33 and the supporting piece 31 are connected through the elastic adhesive 50, and the elastic adhesive 50 seals the gap between the supporting piece 31 and the flexible display screen 33.

The elastic adhesive 50 is pasted on a front surface of the supporting piece 31 adjacent to the left and right sides, and the back surface of the flexible display screen 33 is stacked on the front surface of the supporting piece 31, so that the elastic adhesive 50 is pasted between the supporting piece 31 and the flexible display screen 33.

The elastic adhesives 50 on the same side include a plurality of elastic adhesive pieces 54 linearly arranged along the length of the flexible display screen 33. The adjacent elastic adhesive pieces 54 are separated from each other by a gap. The length of the gap between two adjacent elastic adhesives 54 is less than the length of each elastic adhesive piece 54.

The front surface of the supporting piece 31 defines receiving grooves 312 adjacent to the left and right sides. Two elastic adhesives 50 are respectively received and attached to the corresponding receiving grooves 312. Each elastic adhesive 312 exposes out of the front surface of the supporting piece 31 to facilitate each elastic adhesive 50 to be pasted on the back surface of the flexible display screen 33.

A plurality of receiving grooves 3341 are defined in the back surface of the flexible display screen 33 adjacent to the left and right sides. The two elastic adhesives 50 are respectively received and attached to the corresponding receiving grooves 3341. Each elastic adhesive 50 exposes out of the back surface of the flexible display screen 33 to facilitate the elastic adhesive 50 to be pasted on the front surface of the supporting piece 31.

The front surface of the supporting piece 31 and the back surface of the flexible display screen 33 are defined with receiving grooves communicated with each other adjacent to the left and right sides, and the elastic adhesives 50 each is accommodated and attached to two communicated receiving grooves.

The above are the preferred embodiments of the present disclosure. It should be pointed out that for those of ordinary skill in the art, without departing from the principle of the present disclosure, several improvements and modifications can be made, and these improvements and modifications are also considered to be the protection scope of the present disclosure.

What is claimed is:

1. A flexible display apparatus, comprising a supporting piece and a flexible display screen arranged on the supporting piece, wherein the flexible display screen comprises a bendable area, and at least one elastic adhesive is arranged between a back surface of the flexible display screen in the bendable area and the supporting piece, and the elastic adhesive is located at or near a position between an outer side of the flexible display screen and a corresponding outer side of the supporting piece,
  wherein the flexible display screen comprises a flexible display plate and a protective layer on a back surface of the flexible display plate, and the protective layer is in sliding contact with the supporting piece, and
  wherein a surface of the supporting piece facing the protective layer defines receiving grooves adjacent to left and right sides of the protective layer, respectively, and the at least one elastic adhesive comprises two elastic adhesives, the two elastic adhesives are accommodated and attached to corresponding receiving grooves, respectively, and each elastic adhesive partially exposes out of the surface of the supporting piece facing the protective layer to attach to the protective layer.

2. The flexible display apparatus according to claim 1, wherein the back surface of the flexible display screen is provided with elastic adhesives adjacent to left and right sides of the supporting piece respectively.

3. The flexible display apparatus according to claim 2, wherein the elastic adhesive has a strip shape, and the elastic adhesive extends along a longitudinal direction of the outer side of the flexible display screen.

4. The flexible display apparatus according to claim 2, wherein the elastic adhesives each comprises a plurality of elastic adhesive pieces, and the plurality of elastic adhesive pieces on a same side are distributed along a longitudinal direction of the outer side of the flexible display screen.

5. The flexible display apparatus according to claim 4, wherein a gap is formed between two adjacent elastic adhesive pieces on the same side, and a distance between the two adjacent elastic adhesive pieces is smaller than a length of each elastic adhesive piece.

6. The flexible display apparatus according to claim 1, wherein the back surface of the flexible display screen slides relative to the supporting piece when the bendable area is bent.

7. The flexible display apparatus according to claim 1, wherein a surface of the protective layer facing the supporting piece defines receiving grooves adjacent to the left and right sides of the supporting piece, respectively, and two elastic adhesives are accommodated and attached to the receiving grooves, respectively, and each elastic adhesive partially exposes out of the surface of the protective layer facing the supporting piece to attach to the supporting piece.

8. The flexible display apparatus according to claim 1, wherein a thickness of the elastic adhesive is greater than a depth of the corresponding receiving groove.

9. The flexible display apparatus according to claim 1, wherein a plurality of elastic adhesives spaced apart from each other are arranged in the bendable area between the protective layer and the supporting piece.

10. The flexible display apparatus according to claim 9, wherein each elastic adhesive is an elastic adhesive strip, and the elastic adhesive strip extends along a longitudinal direction of the outer side of the flexible display screen.

11. The flexible display apparatus according to claim 9, wherein each elastic adhesive comprises a plurality of spaced elastic adhesive pieces, and the plurality of elastic adhesive pieces are distributed along a longitudinal direction of the outer side of the flexible display screen.

12. The flexible display apparatus according to claim 1, wherein when the flexible display screen is bent, the supporting piece and the protective layer of the flexible display screen slide relative to each other in the bendable area, and the elastic adhesive produces stretch deformation when the flexible display screen slides relative to the supporting piece.

13. The flexible display apparatus according to claim 1, wherein the elastic adhesive has a tensile deformation amplitude that satisfies $\Delta c = \sqrt{a^2+b^2}-b$, where a is a sliding distance of the flexible display screen relative to the supporting piece, and b is a distance between the flexible display screen and the supporting piece along a thickness direction of the supporting piece.

14. The flexible display apparatus according to claim 1, wherein a stretching direction of the elastic adhesive is inclined to a sliding direction of the protective layer relative to the supporting piece.

15. The flexible display apparatus according to claim 1, wherein the protective layer is a liquid metal sheet.

16. The flexible display apparatus according to claim 1, wherein the elastic adhesive is a double-sided tape.

17. An electronic device comprising a housing, wherein the electronic device further comprises a flexible display apparatus as claimed in claim 1, and the housing comprises a first frame, a second frame, and a hinge connected to the first frame and the second frame, the flexible display apparatus is arranged on the first frame, the second frame, and the hinge.

18. A manufacturing method for a flexible display apparatus, comprising:
  providing a flexible display apparatus comprising a flexible display screen and a supporting piece, the flexible display screen comprising a bendable area; and
  arranging at least one elastic adhesive between a back surface of the flexible display screen in the bendable area and the supporting piece, and the elastic adhesive being located at or near a position between an outer side of the flexible display screen and a corresponding outer side of the supporting piece,
  wherein the flexible display screen comprises a flexible display plate and a protective layer on a back surface of the flexible display plate, and the protective layer is in sliding contact with the supporting piece, and
  wherein a surface of the supporting piece facing the protective layer defines receiving grooves adjacent to left and right sides of the protective layer, respectively, and the at least one elastic adhesive comprises two elastic adhesives, the two elastic adhesives are accommodated and attached to corresponding receiving grooves, respectively, and each elastic adhesive partially exposes out of the surface of the supporting piece facing the protective layer to attach to the protective layer.

* * * * *